United States Patent
Clark et al.

(10) Patent No.: US 11,323,087 B2
(45) Date of Patent: May 3, 2022

(54) METHOD TO PROCESS AN AUDIO SIGNAL WITH A DYNAMIC COMPRESSIVE SYSTEM

(71) Applicant: Mimi Hearing Technologies GmbH, Berlin (DE)

(72) Inventors: Nicholas R. Clark, Royston (GB); Natalia Delgado, Berlin (DE)

(73) Assignee: Mimi Hearing Technologies GmbH, Berlin (DE)

( * ) Notice: Subject to any disclaimer, the term of this patent is extended or adjusted under 35 U.S.C. 154(b) by 9 days.

(21) Appl. No.: 17/081,059

(22) Filed: Oct. 27, 2020

(65) Prior Publication Data

US 2021/0194449 A1 Jun. 24, 2021

(30) Foreign Application Priority Data

Dec. 18, 2019 (EP) .................................. 19217635

(51) Int. Cl.
*H03G 3/00* (2006.01)
*H03G 7/00* (2006.01)
*H03G 9/02* (2006.01)

(52) U.S. Cl.
CPC ............. *H03G 7/007* (2013.01); *H03G 7/002* (2013.01); *H03G 9/025* (2013.01)

(58) Field of Classification Search
CPC ...................................................... H03G 3/00
See application file for complete search history.

(56) References Cited

U.S. PATENT DOCUMENTS

| | | | | |
|---|---|---|---|---|
| 7,903,825 | B1* | 3/2011 | Melanson | H03G 3/32 381/57 |
| 9,716,952 | B2* | 7/2017 | Mauger | H04R 25/43 |
| 10,398,360 | B1 | 9/2019 | Clark | |
| 10,687,155 | B1* | 6/2020 | Clark | H04R 25/305 |
| 11,122,374 | B2* | 9/2021 | Clark | A61B 5/123 |
| 2004/0019481 | A1 | 1/2004 | Saito | |
| 2007/0127752 | A1 | 6/2007 | Armstrong | |
| 2009/0304190 | A1* | 12/2009 | Seefeldt | G10L 25/69 381/56 |
| 2010/0027820 | A1* | 2/2010 | Kates | H04R 25/505 381/312 |
| 2010/0196861 | A1* | 8/2010 | Lu | H04R 25/558 434/112 |
| 2013/0046546 | A1* | 2/2013 | Uhle | G10L 21/00 704/500 |

(Continued)

*Primary Examiner* — Olisa Anwah
(74) *Attorney, Agent, or Firm* — Polsinelli PC (57) ABSTRACT

Disclosed is a method and apparatus for determining one or more operation parameters for a dynamic range compression (DRC) system. The method comprises obtaining, as an input, a parameter indicative of a hearing ability of a user, the parameter relating to a first difference in sound intensity between a maskee at a first frequency and a masker at a second frequency, determining a target value for the parameter, and determining the one or more operation parameters such that a second difference in sound intensity after sound intensity modification by the DRC (between sound intensity of the maskee of the masker) corresponds to the target value for the parameter. The operation parameters are determined such that a dependence of the second difference in sound intensity on the sound intensity of the maskee is minimized for a given range of sound intensities of the maskee.

20 Claims, 10 Drawing Sheets

(56) References Cited

U.S. PATENT DOCUMENTS

| | | | | |
|---|---|---|---|---|
| 2013/0136282 A1* | 5/2013 | McClain | ............... | H03G 9/025 |
| | | | | 381/316 |
| 2015/0230033 A1* | 8/2015 | Sprague | ................ | G10L 13/00 |
| | | | | 381/313 |
| 2015/0304774 A1* | 10/2015 | Ambrose | ................ | H04R 1/10 |
| | | | | 381/74 |
| 2016/0127818 A1* | 5/2016 | Ambrose | ............ | H04R 1/1091 |
| | | | | 381/380 |
| 2016/0336015 A1* | 11/2016 | Pandey | ............... | H04R 25/505 |

* cited by examiner

FIG. 9

METHOD TO PROCESS AN AUDIO SIGNAL WITH A DYNAMIC COMPRESSIVE SYSTEM

FIELD OF INVENTION

This application claims priority to European Application No. EP 19217635.2 entitled "METHOD TO PROCESS AN AUDIO SIGNAL WITH A DYNAMIC COMPRESSIVE SYSTEM," filed Dec. 18, 2019, which is incorporated by reference herein in its entirety.

FIELD OF INVENTION

The present invention relates generally to a method of determining one or more operation parameters for a dynamic range compressor, to provide an enhanced hearing experience to the user.

BACKGROUND

Different options are available to fit audio signals to users' specific hearing ability in order to achieve personalized audio content. Based on information about the user's hearing such as demographic information, an audiogram, or more specific hearing tests, it is possible to fit audio signals to users' specific hearing ability on devices which output audio content.

Traditional sound personalization methods often rely on linear filtering techniques such as equalization (EQ) that apply compensatory frequency gain according to a user's hearing profile. For example, U.S. Pat. No. 9,748,914B2 discloses a method and apparatus for processing an audio signal, based on boosting or attenuating an input signal at one or more frequencies. Likewise, U.S. Pat. No. 9,680,438B2 describes a method for modifying audio signals in accordance with hearing capabilities of an individual who is listening to audio signals played by a music player. Equalization is frequency-specific, however, the sound processing does not depend on the intensity of the audio signal—nor does it dynamically adapt to it over time.

Broadband dynamic range compression (DRC) systems, on the other hand, process an audio signal according to its intensity. Compression is based on adjusting at least two parameters of a compression system (compressor), the threshold and the ratio. The threshold setting determines when (i.e. from what sound intensity) the compressor begins compressing. The lower the threshold is set, the more compression. Likewise, the higher the threshold, the less compression there will be. The ratio setting determines how much the compressor reduces or attenuates the signal. Above the compression threshold, the signal will be attenuated by a certain ratio given by the ratio parameter.

A ratio of 1:1 (one to one) represents no attenuation. These compression ratios are expressed in decibels, so that a ratio of 2:1 indicates that a signal exceeding the threshold by 2 dB will be attenuated down to 1 dB above the threshold, or a signal exceeding the threshold by 8 dB will be attenuated down to 4 dB above it, etc.

A ratio of around 3:1 can be considered moderate compression, 5:1 would be medium compression, 8:1 starts getting into strong compression and 20:1 (twenty to one) through ∞:1 (infinity to one) would be considered "limiting" by most and can be used to ensure that a signal does not exceed the amplitude of the threshold.

However, a broadband DRC affects the whole frequency spectrum at once, i.e. it processes the signal with the same operating parameters all across the frequency spectrum that is audible by the human ear (typically, the human auditory spectrum ranges from 20 Hz to 20 kHz). Thus, broadband DRC processing is not frequency specific.

A multiband DRC, such as disclosed in patent application EP18200368.1, are both signal-level-dependent (per definition of a dynamic range compressor) and frequency-specific (i.e. there is a DRC for each frequency band). To some extent, a multiband DRC may adapt to variations in input level over time, for example by means of being able to modify the reaction time of the compressor, i.e. how long the compressor takes to apply compression, or stop compression (attack or release time constant). However, a multiband DRC does not allow to modify dynamically over time when (i.e. from what intensity) the compressor actually begins compression. This can be proven to be sub-optimal in terms of masking release and signal-to-noise ratios, especially for audio content having a wide dynamic range across a large range of frequencies, such as music. For example, in a case in which a loud sound (higher sound pressure levels) is immediately followed by a fainter sound, the signal-to-noise ratios of the two signals will have high variations when processed by such a system. This may alter the audio output quality for the user.

Such a system is disclosed by Clark et al. (Analysis of compressive properties of the BioAid hearing aid algorithm, International Journal of Audiology 2017). However, the setup of such a system remains completely undisclosed.

To avoid the issues mentioned above, a strong need remains for a stable, robust processing settings with a threshold that dynamically adapts to input level variations over time. Accordingly, it is the object of the present invention to provide such stable, robust processing that dynamically adapts to recorded audio content over time to provide a better quality of experience to users when consuming such content.

SUMMARY

The present invention seeks to address the aforementioned problems. The features according to the invention are specified within the independent claims, advantageous implementations of which will be shown in the dependent claims. The features of the claims can be combined in any technically meaningful way, and the explanations from the following specification as well as features from the figures which show additional embodiments of the invention can be considered.

Methods for the enhancements of audio content, such as recorded audio content, aim at transforming said audio content so that it is perceived as similarly as possible to how the content would be perceived by a user with good hearing abilities. By averaging results of the hearing abilities of people having good or normal hearing abilities, e.g., who can hear sounds having a sound pressure level below 20 dB HL, a profile corresponding to a "reference hearing" profile (e.g., a reference masking contour curve) could be defined.

Typically, "user with mild hearing loss" may refer to a user which cannot hear sounds having a sound pressure level below the range of 20 to 40 dB HL, "user with moderate hearing loss" may refer to a user which cannot hear sounds having a sound pressure level below the range of 40 to 70 dB HL, "user with severe hearing loss" may refer to a user which cannot hear sounds having a sound pressure level below the range of 70 to 90 dB HL, and "user with profound hearing loss" may refer to a user which cannot hear sounds having a sound pressure level below the range of 90 to 120 dB HL.

The audio signal may therefore be customized so that it fits the specific hearing profile of a user.

In the context of the present invention, a hearing profile may refer to information derived from a user's hearing abilities. A user hearing profile may be derived from a user's demographic data such as, but not limited to: age, sex, ethnicity, race, country of residence, average exposure to noise. A user's hearing profile may also be derived from a hearing test, including, but not limited to, pure-tone-threshold hearing tests, which determine the Minimal Audible Threshold (MAT) of a user, represented as an audiogram. A user's profile may also include data derived from suprathreshold hearing tests.

In the context of the present invention, a parameter indicative of hearing ability may be derived from suprathreshold hearing tests, such as tests involving a masking paradigm allowing to measure a user's cochlear frequency selectivity, such as a masked threshold test or a psychoacoustic test. The result of such tests may be referred to as a masking contour curve, measuring the ability of the cochlea to detect the difference between a masker (e.g., a noise signal) and a maskee (e.g., a probe tone).

A parameter indicative of hearing ability derived from tests involving a masking paradigm may be derived from a masking profile, for example. As such, the parameter may be referred to as a masking profile parameter.

A user's masking profile, and hence, a user's parameter indicative of hearing ability, may further be derived indirectly from further hearing tests. For example, a masking profile may be derived from tests that estimate temporal resolution, either on the macro scale using tasks such as gap detection, or on the micro scale using tests that estimate the usefulness of temporal fine structure cues to the individual. A masking profile may further be derived from a measure of the Minimal Audible Threshold (MAT) of a user, such as a pure-tone-threshold hearing test, represented on an audiogram. A user's masking profile may further be derived from a user's demographic data such as, but not limited to: age, sex, ethnicity, race, country of residence, average exposure to noise.

According to an aspect of the present disclosure, a method of determining one or more operation parameters for a dynamic range compression system may comprise obtaining, as an input, a parameter indicative of a hearing ability of a user, the parameter relating to (or being indicative of) a difference in sound intensity between a maskee at a first frequency and a masker at a second frequency, wherein the sound intensity of the maskee and the sound intensity of the masker are such that the masker at the second frequency can still mask the probe tone at the first frequency. This may mean that for an average listener, the probe tone at the first frequency would not be audible in the presence of the masker at the second frequency, but would become audible if its sound intensity were slightly increased or if the sound intensity of the masker were slightly decreased. This sound intensity difference is referred to as the first difference. The first difference may also refer to a pre-processing difference in sound intensity between a maskee at a first frequency and a masker at a second frequency. The method may further comprise determining a target value for the parameter based on the actual value of the parameter and a value for the parameter that would be expected for a reference user. The method may further comprise determining the one or more operation parameters such that a second difference in sound intensity between said sound intensity of the maskee (at the second frequency) after dynamic range compression by the dynamic range compressor configured with the one or more operation parameters and said sound intensity of the masker (at the first frequency) after dynamic range compression by the dynamic range compressor configured with the one or more operation parameters corresponds to the target value for the parameter. The second difference may also refer to a post-processing difference in sound intensity between a maskee at a first frequency and a masker at a second frequency. The method may further comprise determining the one or more operation parameters, which further involves determining the one or more parameters such that a dependence of the second difference in sound intensity on the sound intensity of the maskee is minimized for a given range of sound intensities of the maskee.

The dynamic range compression system may, for example, be a dynamic range compressor.

A masked probe tone may not be discernible, for the user, from the masker. An unmasked probe tone may be discernible, for the user, from the masker. If the masker can still mask the maskee, it can likewise be said that the masker barely masks the maskee, or that the sound intensity of the masker is at the threshold from masking to not masking: the transition from undiscernible (masked) to discernible (unmasked) may not be immediately perceptible, but follow a psychometric function. The second difference corresponding to the target value for the parameter may mean that the second difference equals the target value.

It is an advantage of the present invention to provide a processing that is stable and robust to input level signal variations over time, with an enhanced hearing experience personalized to the user. More signal components are rendered above masked threshold, giving the listener a greater chance at detecting perceptually relevant signal components Hence, typically, the audio signal outputted using the processing parameters will sound crisper, masking noise will be attenuated, and speech intelligibility will be increased.

In one embodiment of the present invention, the method further comprises obtaining, as an input, a model function of dynamic range compression by the dynamic range compressor. The method may further comprise determining said sound intensities of the maskee and the masker after dynamic range compression, in terms of the parameters of the model function, by applying the model function to said sound intensities. The method may further comprise determining the one or more operation parameters based on said sound intensities of the maskee and the masker after dynamic range compression in terms of the parameters of the model function.

In the context of the present invention, the dynamic range compressor being configured with the one or more operation parameters means that the dynamic range compressor applies a compression function that is given by the model function when the one or more operation parameters are used as the parameters of the model function.

In one embodiment of the present invention, the method may further comprise determining the given range of sound intensities of the maskee based on a dynamic range of input levels of audio content that is to be processed by the dynamic range compressor.

Alternatively, the given range may be determined in accordance with a choice among a plurality of preset modes.

In an embodiment of the present invention, the one or more operation parameters may include a ratio of the dynamic range compressor; and determining the one or more operation parameters further involves applying the condition that the ratio has a predetermined value.

In an embodiment of the present invention, the one or more operation parameters may include a threshold of the dynamic range compressor; and determining the one or more operation parameters further involves applying the condition that the threshold has a predetermined value or is within a predetermined margin around the predetermined value.

In an embodiment of the present invention, the target value for the parameter may be determined using a look-up table.

The look-up table may assign respective target values to each of a plurality of possible values of the parameter.

In an embodiment of the present invention, determining the target value for the parameter may involve determining a desired improvement amount for the outcome from the application of the parameter based on the actual value of the parameter and a value for the parameter that would be obtained for the reference user.

In an embodiment of the present invention, the reference user may be assumed to have good hearing ability.

The reference user may have (statistically) normal hearing ability, or perfect hearing ability, depending on the specific application.

In an embodiment of the present invention, the second frequency may be different from the first frequency by a predetermined relationship between both frequencies.

In an embodiment of the present invention, the method may comprise determining the one or more operation parameters for each of a plurality of frequency bands, and for each of the plurality of frequency bands, the first frequency may be chosen to lie within the respective frequency band and the second frequency is chosen to not lie within the respective frequency band.

In an embodiment of the present invention, the ratio of the first frequency and the second frequency does not vary between different frequency bands.

In an embodiment of the present invention, the method further comprises using the determined one or more operation parameters for configuring the dynamic range compressor.

In an embodiment of the present invention, the method of processing an audio signal may comprise receiving the audio signal. The method may further comprise determining one or more operation parameters for a dynamic range compressor using the method of any one of the preceding claims and using the determined one or more operation parameters for configuring the dynamic range compressor. The method may further comprise processing the audio signal. Processing the audio signal may involve applying dynamic range compression to the audio signal using the dynamic range compressor.

In the context of the present invention, using the dynamic range compressor shall mean applying dynamic range compression by means of the dynamic range compressor.

In an embodiment of the present invention, the method of processing an audio signal may further comprise outputting the processed audio signal.

In an embodiment of the present invention, an apparatus may comprise a processor and a memory coupled to the processor for storing instructions for execution by the processor, wherein the processor is adapted to perform the steps of the method according to any one of the preceding claims.

In the context of the present invention, the apparatus may be an apparatus for determining one or more operation parameters for a dynamic range compressor, or an apparatus for processing an audio signal, for example.

In the context of the present invention, the terms "target value" herein may refer to a desired value, of ΔMMR for example, reflecting an enhancement of hearing ability. Here, ΔMMR indicates a change to the maskee-to-masker ratio, as defined below.

In the context of the present invention, the terms "dynamic range compressor" herein refer to a multi-band compression system in which the processor is a dynamic range compressor (DRC). In the context of the present invention, each frequency band associated to a processor such as a DRC may also be referred to as a channel.

A multi-band compressor has the advantage of giving the ability of setting up operation parameters for each band of frequencies or channel separately. In an embodiment of the present invention, for each channel, at least two operation parameters of the multi-band processor are determined or altered. The terms "operation parameter" herein refer to any parameter influencing the operation of a dynamic range compressor. The parameters that are determined or altered may comprise the threshold and ratio values of each band of the DRC. Here, the threshold defines the signal level above which gain expansion or gain reduction is applied to the audio signal, and the ratio defines the actual gain that is applied for signal levels above the threshold.

A set of parameters (e.g., including the threshold and the ratio) may be set for every frequency band or channel in a group of frequency bands or channels (e.g., for every frequency band of the human auditory spectrum).

Further parameters of a multiband DRC may be determined or modified as well. These parameters may comprise, but are not limited to, delay between envelope detection and gain application, integration time constants used in the sound energy envelope extraction phase of dynamic range compression, and static gain.

In the context of the present invention, the term "enhanced" may be understood as providing an objectively and/or subjectively improved sound quality to the user.

In an embodiment of the present invention, the output audio device from which the enhanced audio signal is outputted may be a mobile phone, a smartphone, a tablet, a computer, a television set, a hearable (such as a headphone or an earpiece), a smart speaker, a hearing aid, a speaker system, a home entertainment system, a car entertainment system, an in-flight entertainment system, or any device outputting audio signals (for example, but not limited to, for entertainment purposes).

BRIEF DESCRIPTION OF THE DRAWINGS

In order to describe the manner in which the above-recited and other advantages and features of the disclosure can be obtained, a more particular description of the principles briefly described above will be rendered by reference to specific embodiments thereof, which are illustrated in the appended drawings. Understand that these drawings depict only exemplary embodiments of the disclosure and are not therefore to be considered to be limiting of its scope, the principles herein are described and explained with additional specificity and detail through the use of the accompanying drawings in which.

DETAILED DESCRIPTION

Various embodiments of the disclosure are discussed in detail below. While specific implementations are discussed, it should be understood that this is done for illustration purposes only. A person skilled in the relevant art will recognize that other components and configurations may be used without parting from the spirit and scope of the disclosure.

Figure 1:
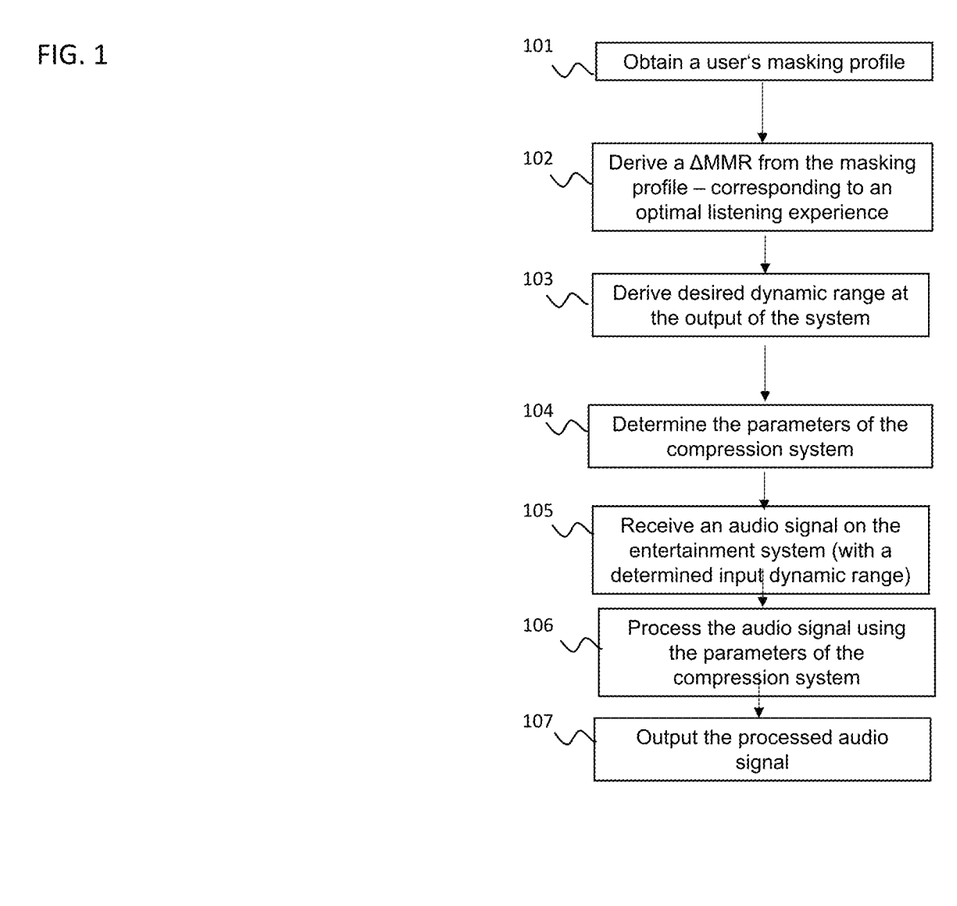
FIG. 1 illustrates an example method of the audio processing method according to one or more aspects of the present disclosure.

FIG. 1 is a flowchart illustrating the successive steps of a fitting method according to the present invention.

The MMR (maskee to masker ratio) is a measure of the ratio between the level of the maskee (e.g., audio signal or probe tone) and the level of the masker (e.g., noise). This measure may be used to evaluate to what extent a maskee (i.e., a sound that is masked by another sound) is audible in a masker (i.e., a sound that masks another sound), at a certain frequency. In other words, the MMR expresses how easy or difficult it is to perceive a maskee in presence of a masker. Masking release denotes the phenomenon occurring when the masking effect of a masker over a maskee is reduced. This may result in an increase of the MMR (maskee to masker ratio).

The aim of the method according to the present invention is the following. A user having an associated measure of hearing ability (e.g., given by or derived from a hearing test result, or information such as an age, allowing to derive insights about his hearing ability). An example of a measure of hearing ability is the MMR at a certain frequency. The measure of hearing ability of the user may be compared to a desirable value of hearing ability, allowing the user to better perceive certain sounds, using the phenomena of masking release. Operating parameters of a dynamic compression system may then be adapted to dynamically optimize the threshold of the whole system, taking the hearing ability of the user into account, but also the audio content inputted into the compression system (input audio content). The audio content outputted from the audio system (output audio content) should then be optimized for the user.

In step 101 of the fitting method, the masking profile of a user is obtained. Masking may be defined as the rendering of one sound inaudible by the presence of another sound. For example, a maskee (e.g. a signal tone) may be masked by a masker (e.g. noise or band limited noise). Simultaneous masking occurs when a sound is made inaudible by a masker presented simultaneously with the maskee. Temporal, or non-simultaneous masking occurs when a masker gives rise to a masking effect on a signal that occurs before or after the masker.

A user's masking profile may be derived from hearing test results. A masking profile may be derived directly from hearing tests involving a masking paradigm, such as a masked threshold test or a psychoacoustic test, for example.

A user's masking profile may further be derived indirectly from further hearing tests. For example, a masking profile may be derived from tests that estimate temporal resolution, either on the macro scale using tasks such as such as gap detection, or on the micro scale using tests that estimate the usefulness of temporal fine structure cues to the individual.

A masking profile may further be derived from a measure of the Minimal Audible Threshold (MAT) of a user, represented on an audiogram.

A measure of the MMR is given by or derived from a comparison of the level of a desired signal (the maskee) at a certain frequency to the level of a masker at a certain frequency. The MMR is visible on a masking curve, as the masking curve is built by playing simultaneously a masker and a maskee and measuring the user response, i.e. measuring when the user is able to detect the maskee in presence of the masker. Typically, the MMR may be derived from the detection efficiency, $Q_{10}$ and/or rounded-exponential (RoEx) fitting functions. Detection efficiency, $Q_{10}$ and RoEx functions may be derived from the user's hearing profile. The detection efficiency corresponds to the difference in sound intensity between the maskee and the masker at the same frequency, and can for example be measured in a hearing test such as a psychoacoustic tuning curve (PTC) or a Masked Threshold (MT) test. The Q10 may generally be defined as a ratio between the tip frequency of the PTC or MT curve and a measure of width (or broadness) of the PTC or MT curve. The RoEx fit may generally be defined as an interpolation of the PTC or MT curves.

It may be considered a good practice to take the MMR value (MMR threshold) at a frequency away from the center frequency $f_c$ (i.e., frequency of the maskee) defined by a standard relationship, e.g.:

$$fc(\text{masker})=0.5 \times fc(\text{maskee})$$

or $$fc(\text{masker})=1.5 \times fc(\text{maskee})$$

Other (predefined) relationships between the (center) frequency of the maskee and the (center) frequency of the masker for which the MMR is taken are feasible as well. In the context of the present invention, the (center) frequency of the maskee, $f_c(\text{maskee})$ may be referred to as a first frequency $f_1$, and the (center) frequency of the masker, $f_c(\text{masker})$ may be referred to as second frequency $f_2$.

In some embodiments, a value of the MMR may be determined via $$MMR = \frac{I_{maskee}(@f_1)}{I_{masker}(@f_2)}$$

or, in the log domain, via $$MMR = I_{maskee}(@f_1) - I_{masker}(@f_2)$$

where $I_{maskee}$ is the sound intensity of the maskee and $I_{masker}$ is the sound intensity of the masker.

Having a value or estimate value of the MMR threshold allows evaluating the hearing of a user, i.e. "good", "average", "impaired".

The original MMR (original MMR threshold) of the user may be compared to a target MMR (target MMR threshold), that would reflect an optimized ability to distinguish a maskee from a masker. This may also be defined as the masking release, i.e. a decrease of the effect of the masker.

In step 102, a desired Δ "maskee-to-masker ratio" (ΔMMR) is derived from the masking profile of the user. The ΔMMR may be seen as a measure of by how much the MMR of the user changes by the processing according to embodiments of the invention.

On the other hand, the ΔMMR may also be seen as a measure of consistency of the masking release, i.e. a measure reflecting how much the masking release will depend on the input level. The ΔMMR is calculated by comparing the MMR before and after processing, for different input levels. A desired ΔMMR may be derived from a hearing profile, i.e. derived from an original MMR. This can be done using an exemplified look-up table.

|  | "Good" | "Average" | "Impaired" |
|---|---|---|---|
| Original MMR | −2 to −4 dB | −4 to −6 dB | −6 to −8 dB |
| Desired ΔMMR | 1 | 2 | 4 |

In step 103, a sound intensity (or a range of sound intensities) at the output of the system is determined. This may involve analyzing the output audio content of the system as to its sound intensity (e.g., current sound intensity or averaged sound intensity for a certain period of time).

It is further assumed that a Model function of the processing by the DRC, f, that has a certain set of parameters (processing parameters) and that maps the input sound intensity X to an output sound intensity Y, is known:

$$f(X, \text{parameters}) = Y$$

Knowing the model function f of the processing makes it possible, given the input sound intensity X and the parameters, to estimate a sound intensity Y at the output of the system. It is also possible, if the output and input sound intensities Y and X are known, to determine the processing parameters.

This may further be achieved by setting a certain number of conditions, to narrow down the parameters to sets of parameters fulfilling these conditions.

One condition to be fulfilled for the masking release may be that the difference between the $MMR_{final}$ of the signal after processing equals the $MMR_{original}$ of the signal before processing plus the desired ΔMMR:

$$MMR_{final} = MMR_{original} + \Delta MMR$$

Per definition, the new $MMR_{final}$ also corresponds to the difference between the sound level (sound intensity) of the maskee (at its center frequency $f_c$(maskee)) after the processing and the sound level (sound intensity) of the masker (at its center frequency $f_c$(masker)) after the processing, i.e.

$$MMR_{final} = f(\text{sound level of the maskee}) - f(\text{sound level of the masker})$$

With the function f corresponding to the processing with its processing parameters this leads to the following equation:

$$f(\text{sound level of the maskee}) - f(\text{sound level of the masker}) = MMR_{original} + \Delta MMR$$

Another condition may be the range of the input level (based on dynamic range of the track or input audio content).

A further condition may be that the ratio of the dynamic compressor system may be fixed.

Further optional conditions may also be fixed. For example, one of the processing parameters may be set based on values of $MMR_{original}$.

Adding a sufficient amount of conditions will allow minimizing the number of different sets of parameters, ideally to one single set. However, applying a single condition may be sufficient in some cases.

In step 104, sets of parameters of the compression system are determined. This may be done by imposing one or more of the aforementioned conditions. For example, the condition that the difference between the $MMR_{final}$ of the signal after processing equals the $MMR_{original}$ of the signal before processing plus the desired ΔMMR.

In step 105, an audio signal having a known dynamic range (condition in step 103) is received on a playback device (e.g., an entertainment device, such as a television, a home cinema, a home theater, a media center appliance, a device that combines abilities of a personal computer with a software application supporting video, photo, music playback, video recording functionality, Hi-Fi systems, and loudspeaker systems, an entertainment system in a car, to an in-flight entertainment system in a back seat, a smartphone, a tablet, a hearable, a smart speaker or a computer, for example). It should be noted that the playback device (audio entertainment system) is no hearing aid that picks up sound in real-time and plays the processed sound via an in-ear device to the user.

The audio signal may be received from a storage device of the playback device (audio entertainment system) such as a hard disk or a music CD/DVD. Alternatively, the audio signal may be received by a receiver of the playback device (audio entertainment system) from an external transmitter, via a wired or wireless transmission path such as an audio streaming path or a radio broadcasting service. Typically, the audio signal is not recorded in real time by the playback device (audio entertainment system) but is received from a local or remote storage device where it has been stored.

In step 106, the audio signal is processed using the sound personalization signal processing algorithm (i.e., using function f with the determined processing parameters). In other words, the sound personalization signal processing algorithm is applied to the audio signal and changes the signal characteristics so as to provide an enhanced hearing experience for one or more users (e.g., the user for whom the hearing ability has been initially determined). In some embodiments, the sound personalization signal processing algorithm may be a multiband dynamic range compression algorithm. This may imply that parameters for the function f are determined in multiple frequency bands, possibly based on MMR and desired ΔMMR values in multiple frequency bands.

In step 107, the processed audio signal is outputted from the playback device (entertainment system) and played back to the one or more users, e.g. via a transducer such as a loudspeaker or headphones.

Figure 2:
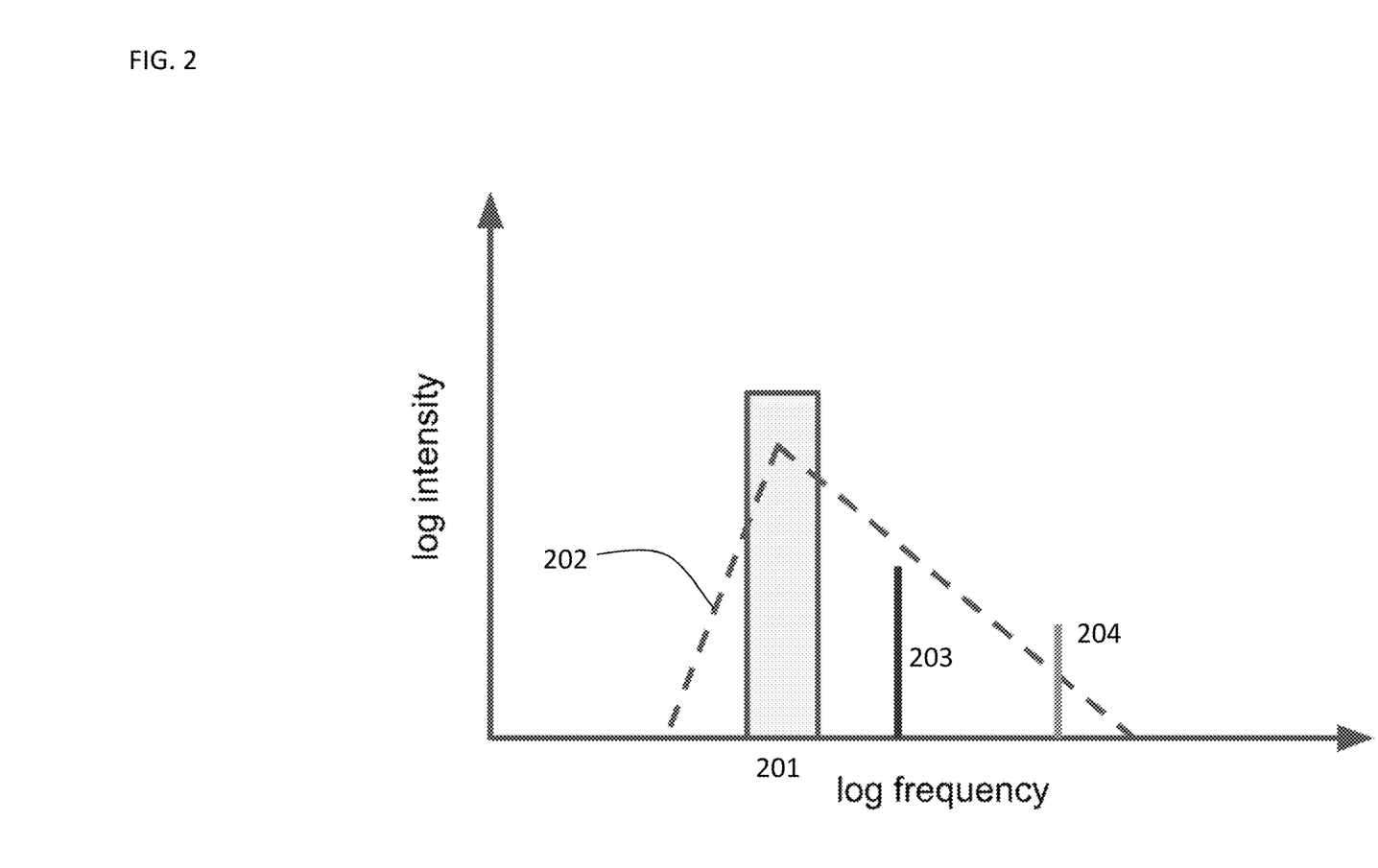
FIG. 2 illustrates the concept of masking release.

FIG. 2 is an illustration of the concept of masking. A masker 201, e.g. a band limited noise, having a certain center frequency and sound intensity, is played. Masking flanks will emanate from the masker's energy and generate an area 202 in the frequency/intensity spectrum, in which signals will be masked. The masking effect decays as a function of frequency from the energy locus (corresponding to the masker), and is typically more effective at frequencies higher than that of the masker, and less effective at lower frequencies.

For example, the signal 203 is in the masked area 202, and will not be audible. The signal 204 is, on the contrary, not in the masked area 202, and will be audible.

Figure 3A:
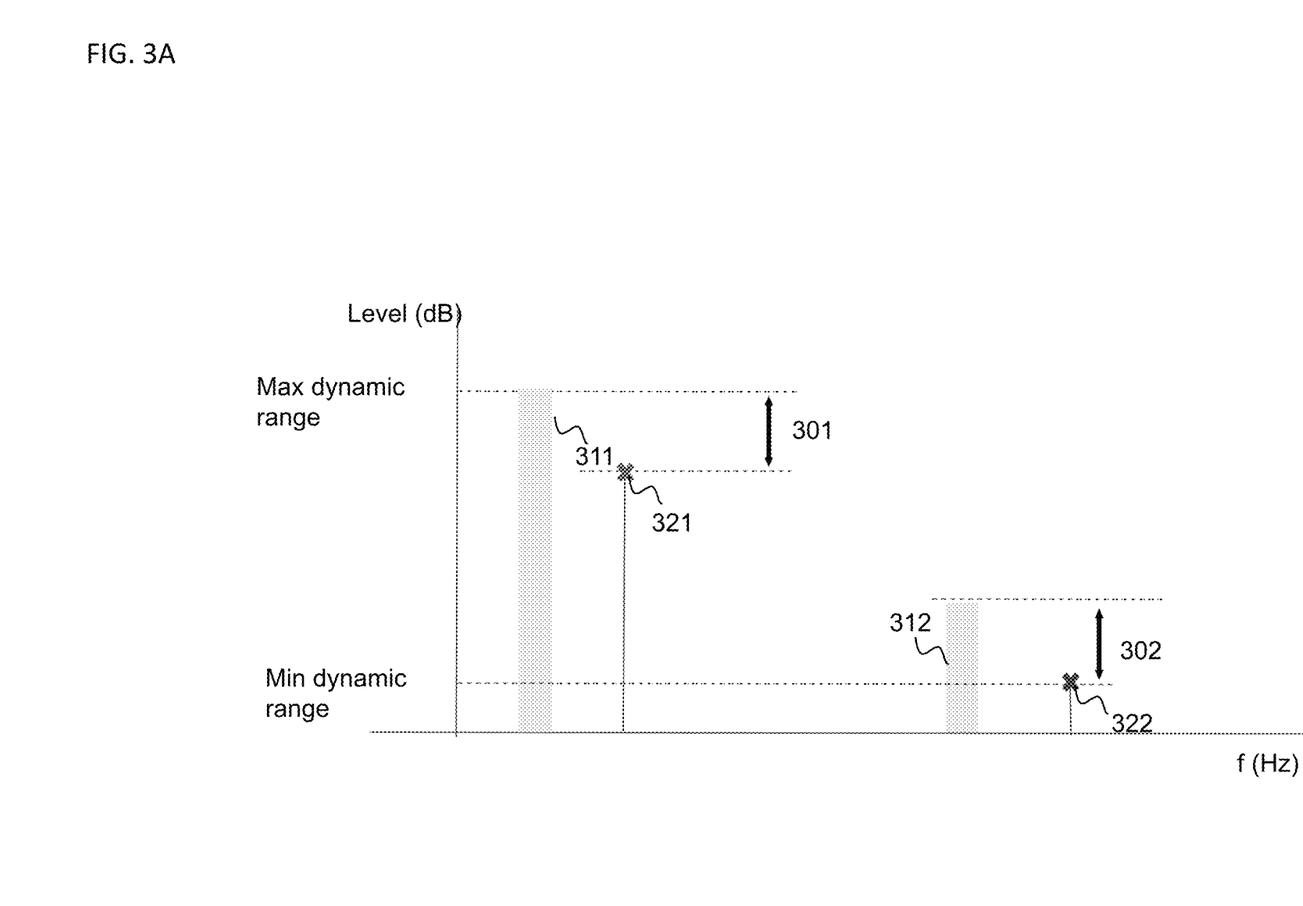
FIGS. 3A-B illustrate the concept of maskee-to-masker ratio (MMR).
Figure 3B:
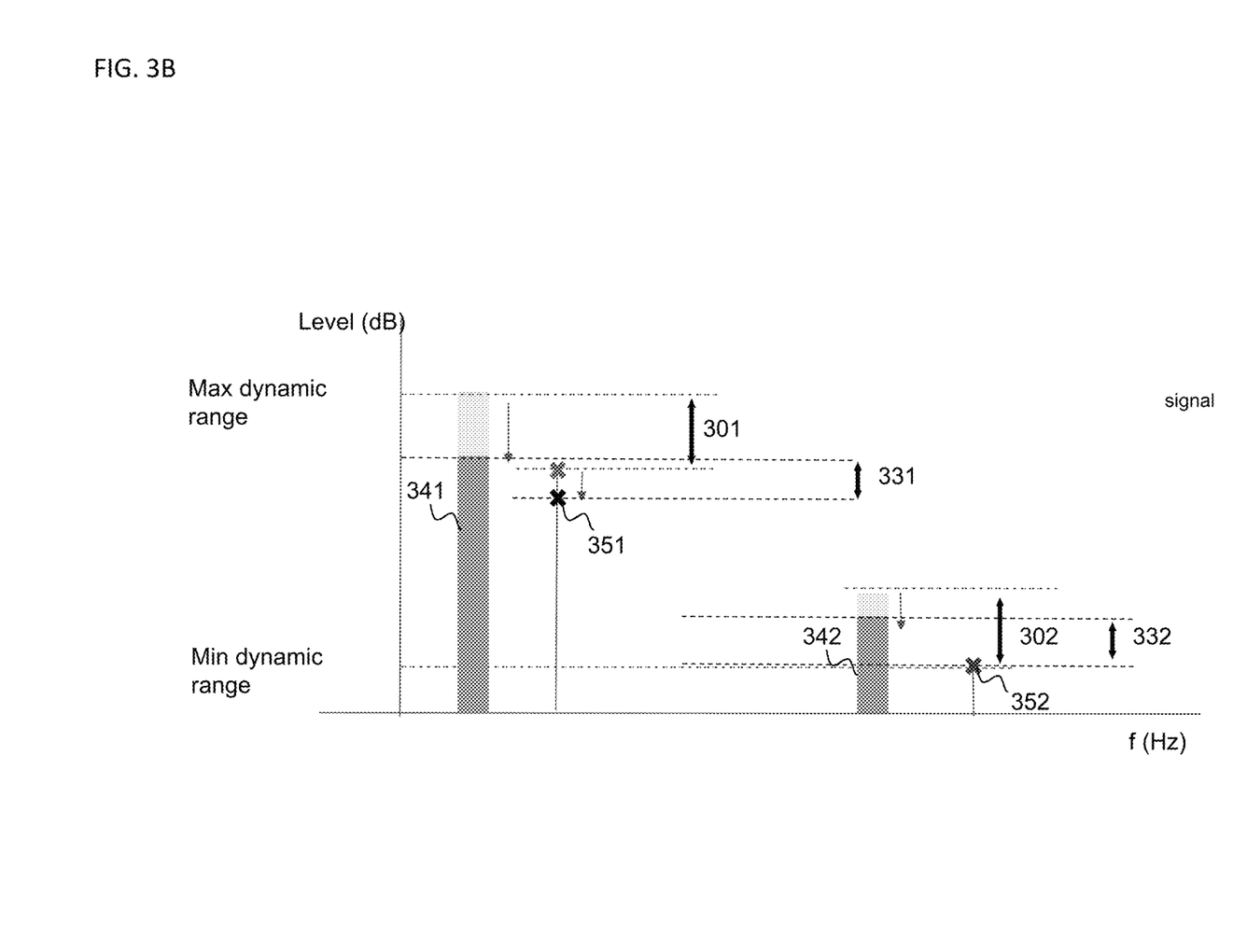

FIGS. 3A-B are example illustrations of the MMR before (FIG. 3A) and after (FIG. 3B) processing has occurred. In FIG. 3A, the MMR ($MMR_{original}$) 301 and 302 correspond to the difference in level between the masker 311 and 312 and the maskee 321 and 322 (in the log domain), at different sound intensities and frequencies. It is assumed that the masker can just barely mask the maskee. After processing, a new MMR ($MMR_{final}$) 331 and 332 may be computed, as illustrated on FIG. 3B with the difference in level between the processed maskers 341 and 342 and maskees 351 and 352.

To show consistent masking release, the differences between the original and final values of the MMR (i.e. the ΔMMR) ideally remain the same wherever the masker and maskee are in the frequency and intensity spectrum.

In order to demonstrate both efficient and consistent masking release, the output of the system should result in higher values of MMR (meaning that the level of the masker may decrease relatively to the level of the maskee, i.e. that less masking is taking place), while the ΔMMR varies a little as possible (meaning that there will be little-to-no variations in masking release, and thus that the masking release will be consistent).

Figure 4A:
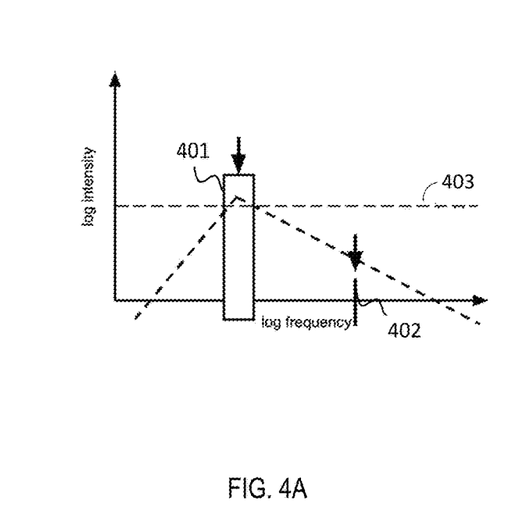
FIG. 4A-C illustrate three scenarios of masking after processing.
Figure 4B:
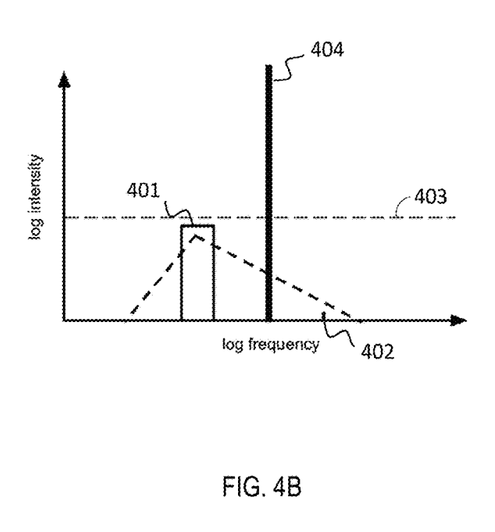
Figure 4C:
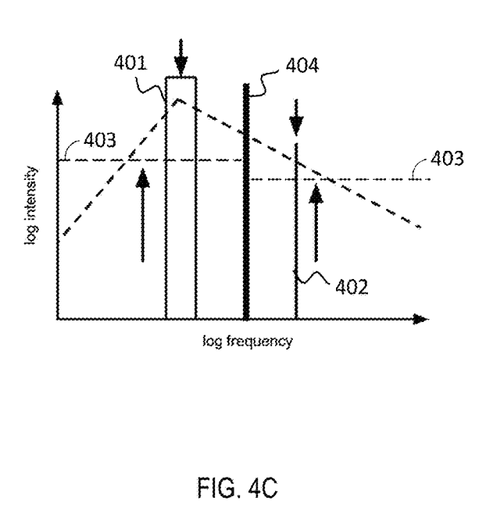

FIG. 4A-C illustrate three masking scenarios after processing. On FIG. 4A, the masker 401 and the maskee 402 are in the same frequency band. Both the masker and the maskee are attenuated by an equal amount by the processing, as the compression threshold 403 is the same throughout the whole frequency range of the compressor and will affect both the masker 401 and the maskee 402 in the same way. That is, for a given frequency band, the most intense component (i.e., the masker 401 in this example) will drive the action of the DRC, and both masker and maskee will be attenuated by an equal amount. Therefore, there is no alteration to the MMR between the components and the maskee remains inaudible. The MMR does not change (i.e. ΔMMR=0), so that there is no improvement in perceived audio quality for the user, which is not a desired result. This scenario typically occurs in broadband DRCs. On FIG. 4B, the masker 401 and the maskee 402 are in different frequency bands, delimited by the boundary 404 between two frequency bands. The masker 401 and maskee 402 may thus be processed independently. However, both the masker 401 and the maskee 402 are below the compression threshold 403. None of them is altered, and ΔMMR is also equal to zero, so that there is no improvement in perceived audio quality for the user, which is not a desired result. On FIG. 4C, the masker 401 and the maskee 402 are located in different frequency bands, delimited by the boundary 404 between two frequency bands. The masker 401 and the maskee 402 may thus be processed independently, and the compression thresholds 403 are specific to each frequency band. The masker 401 and the maskee 402 are both above the respective dynamic range compression (DRC) thresholds 403 in their respective frequency bands, but as the compression thresholds 403 may be different, the masker 401 and the maskee 402 will be attenuated in different ways. The threshold is temporally changing and does not have the same value for the masker in one frequency band, and for the maskee in an adjacent frequency band. As a consequence, the intensity difference between masker and maskee is reduced, i.e. the sound intensity of the maskee has increased relative to the sound intensity of the masker compared to the situation prior to processing. In this case, the MMR increases. This results in an improvement of the detectability of the maskee, and thus an improvement of a user's ability to hear otherwise masked sonic information, which is a desired result.

Figure 5:
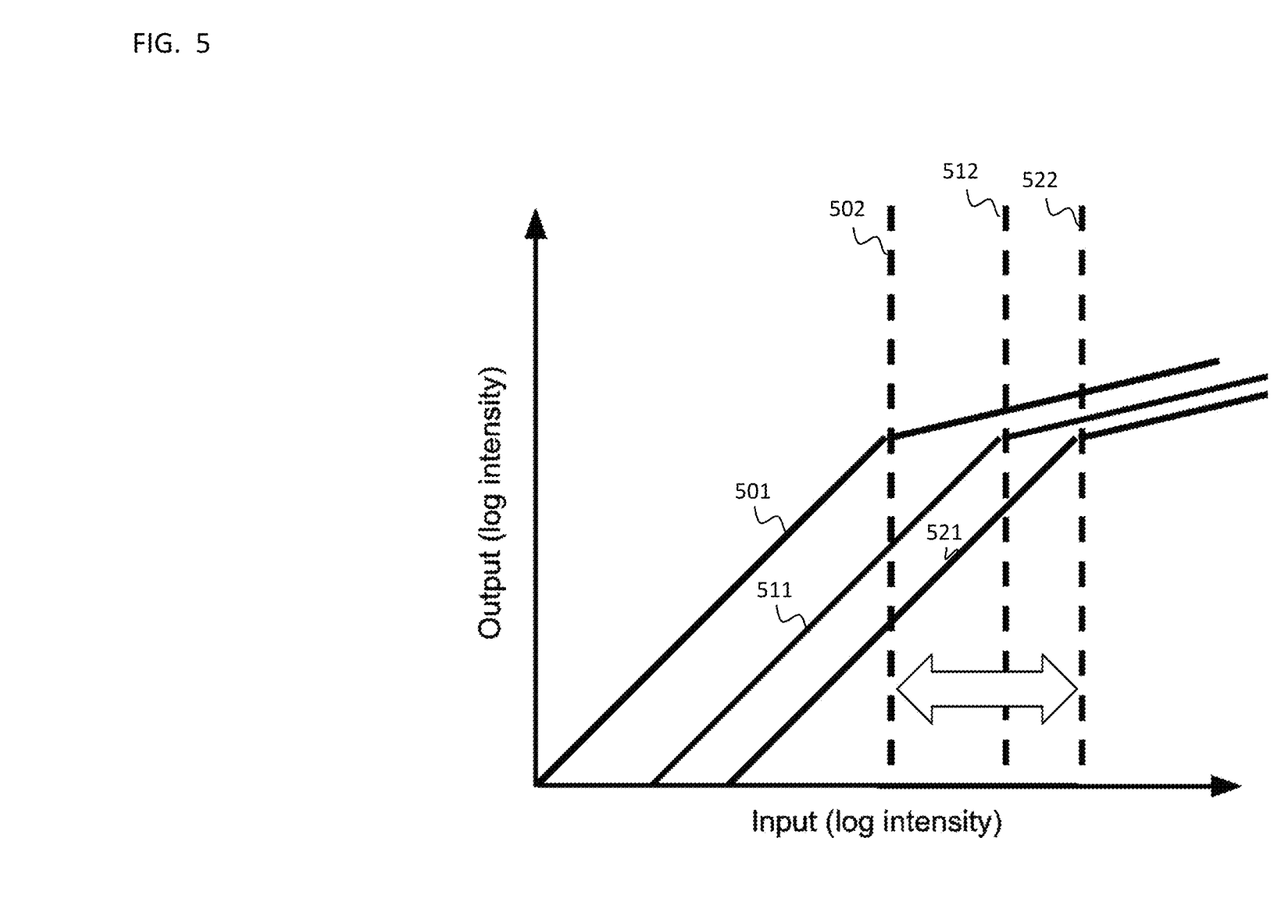
FIG. 5 illustrates the input/output function of a multiband compressor with a dynamic threshold.

FIG. 5 is an input-output representation of a multiband dynamic range compressor with a dynamic threshold (dMBDRC). The threshold of the dMBDRC adapts to the source material over time. This has the effect of shifting the base of the compression curve ("broken stick") 501, 511 and 521 in the horizontal axis. The three input/output (I/O) functions show the behavior of the composite system for sounds of given input levels after the system has adapted to the ambient level. The thresholds 502, 512 and 522 that are dynamically moving over time on the horizontal axis of FIG. 5 may correspond to the compression thresholds 403 moving along the vertical axis in FIG. 4C.

Figure 6:
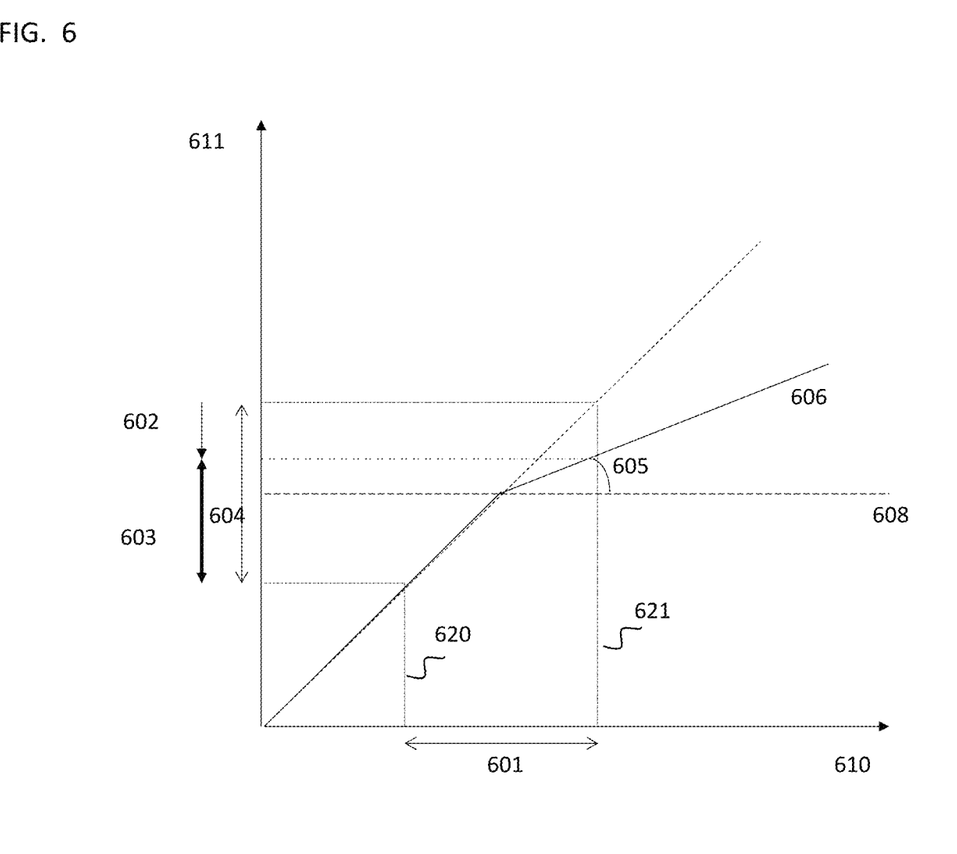
FIG. 6 illustrates the difference between original MMR and the new MMR at the output of the compressive system.

FIG. 6 is an input-output representation of a dMBDRC processing a maskee 620 and a masker 621 having different sound intensities. The original MMR 604, ΔMMR 602 and MMR$_{final}$ 603 appear on the output axis (vertical axis) 611. The original MMR 604 is illustrated both at the input 601 (on the horizontal axis 610) and output 604 (on the vertical axis 611) of the system. It is assumed that the sound intensity of the maskee is lower than the sound intensity of the masker, and therefore the MMR will always have negative values (in the log domain), according to the formula:

$$MMR = I_{maskee}(@f_1) I_{masker}(@f_2)$$

This implies that the MMR value is inversely correlated to the length of the arrows 601, 603 and 604 represented on FIG. 6. Hence, the higher the MMR value, the shorter the arrow. The original MMR 604 at the output remains the same as the MMR 601 at the input of the system, in a situation where no compression occurs. In a situation where compression occurs, with a compression curve ("broken stick") 606 having a compression threshold 608 and a ratio 605, the MMR$_{final}$ 603 is different from the original MMR 601 at the input of the system, and calculated according to the formula:

$$MMR_{final} = MMR_{original} + \Delta MMR$$

At the output of the system, the new MMR 603 equals a sum of the original MMR 604 and the ΔMMR 602.

Figure 7:
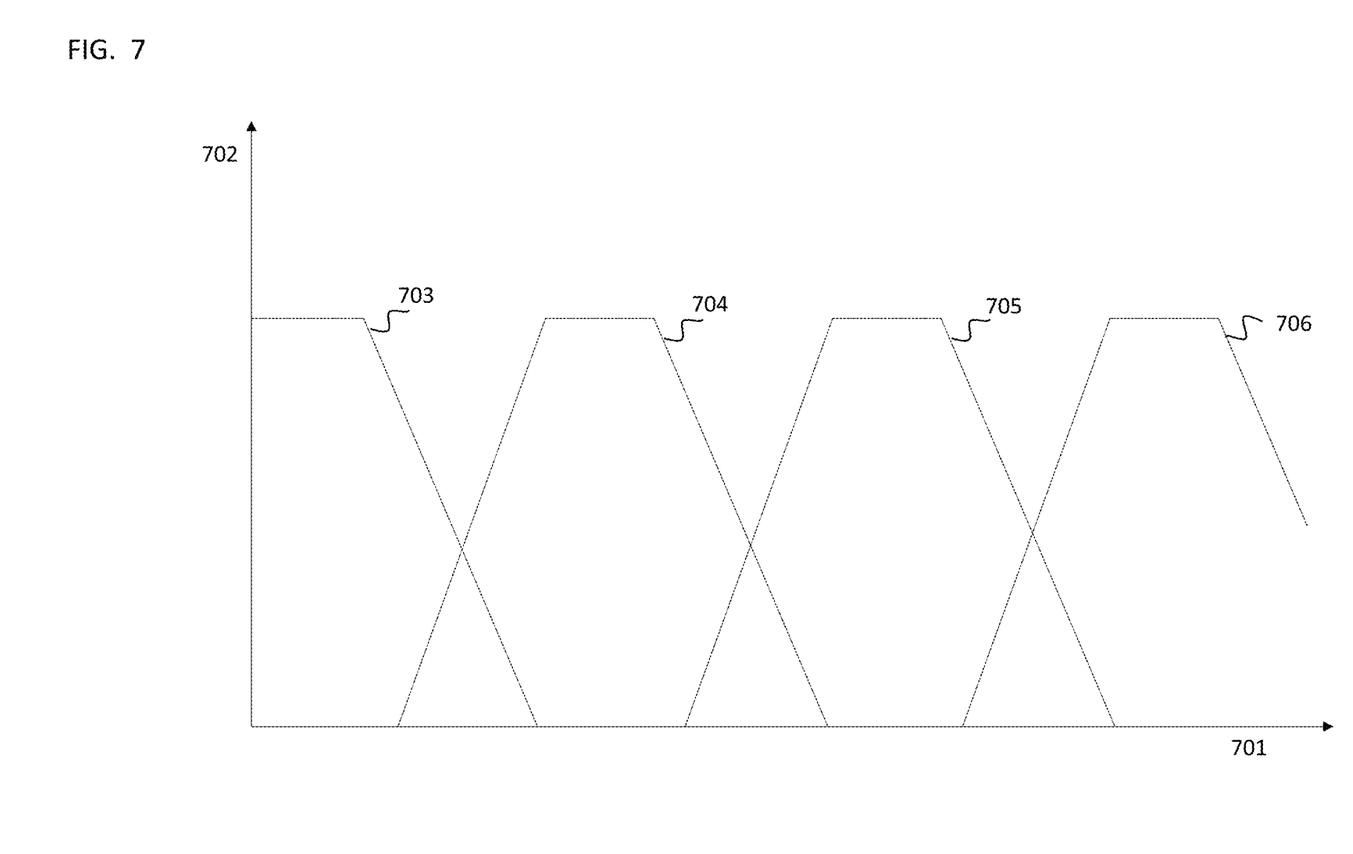
FIG. 7 illustrates the notion of frequency bands.

FIG. 7 illustrates how a portion of the frequency spectrum is divided into frequency bands. The values indicated on the horizontal axis 701 are the center frequencies of respective frequency bands. The vertical axis 702 is the level in dB FS (dB full scale). Each of the frequency bands 703, 704, 705, 706 may correspond to a respective DRC channel.

A masking profile can be determined in each frequency band, for example when a hearing test allowing to determine parameters of hearing ability, is taken throughout the human auditory spectrum. Therefore, a set of parameters (e.g., a compression threshold) may be determined per frequency band.

Applying techniques according to embodiments of the disclosure results in dynamically changing operation parameters for the DRC system, such as a dynamically changing compression threshold. In particular, the operation parameters may dynamically change in accordance with the intensity (sound level) of the input sound. A time constant (first time constant) of this dynamic change may be comparatively short, i.e., the operation parameters may change comparatively fast if the input sound level changes.

Additionally, techniques according to embodiments of the disclosure may be embedded into, or used in the context of, systems that adapt the compression threshold of the DRC by means of a feedback loop. This adaptation may proceed directly, for example by directly adapting the compression threshold, or indirectly, for example by adapting the input sound level at the input of the DRC. Adaptation by the feedback loop may be slow compared by the aforementioned dynamic changes of the operation parameters of the DRC. Thus, a second time constant of the feedback-based adaptation may be longer (e.g., significantly longer, such as longer by an order of magnitude or more) than the first time constant. Thereby, the DRC can appropriately handle transient events and slowly shifts its operating point to the mean level of the input.

Figure 8A:
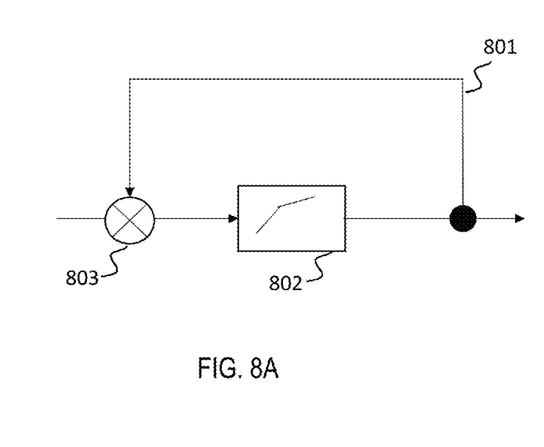
FIG. 8A-C illustrate possible implementations of the current invention.
Figure 8B:
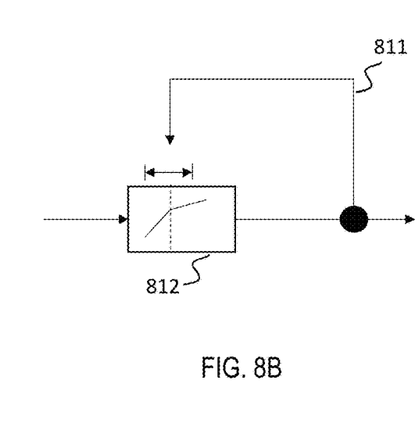
Figure 8C:
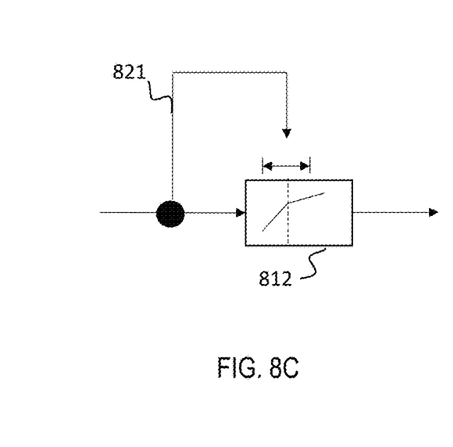

Implementation examples of using techniques according to embodiments of the disclosure in systems having a feedback loop are schematically illustrated in FIG. 8A-C. The DRC (or feed-forward compressor) in each of these scenarios may be operated according to embodiments of the disclosure, i.e., its operation parameters may be determined as set out above. In FIG. 8A, the feedback pathway 801 sends a signal to an attenuator 803 before the feed-forward (FF) compressor 802. The processing parameters of the FF compressor, as an example of a DRC, may be determined in accordance with embodiments of the invention. Therein, it is to be noted that a time constant of the adaptation of the input sound level by means of the feedback pathway and the attenuator is large compared to a time constant of the adaptation of the processing parameters of the FF compressor, as noted above. In FIG. 8B, the feedback pathway 811 modulates the threshold of the feed-forward compressor 812 directly. In FIG. 8C, the threshold of the feed-forward compressor 822 is modulated by a feedforward pathway 821.

Techniques according to this disclosure allow to set parameters for the different parts of the dynamic range compression system. As a result, the threshold of the whole system dynamically adapts to the audio content inputted into the system.

Figure 9:
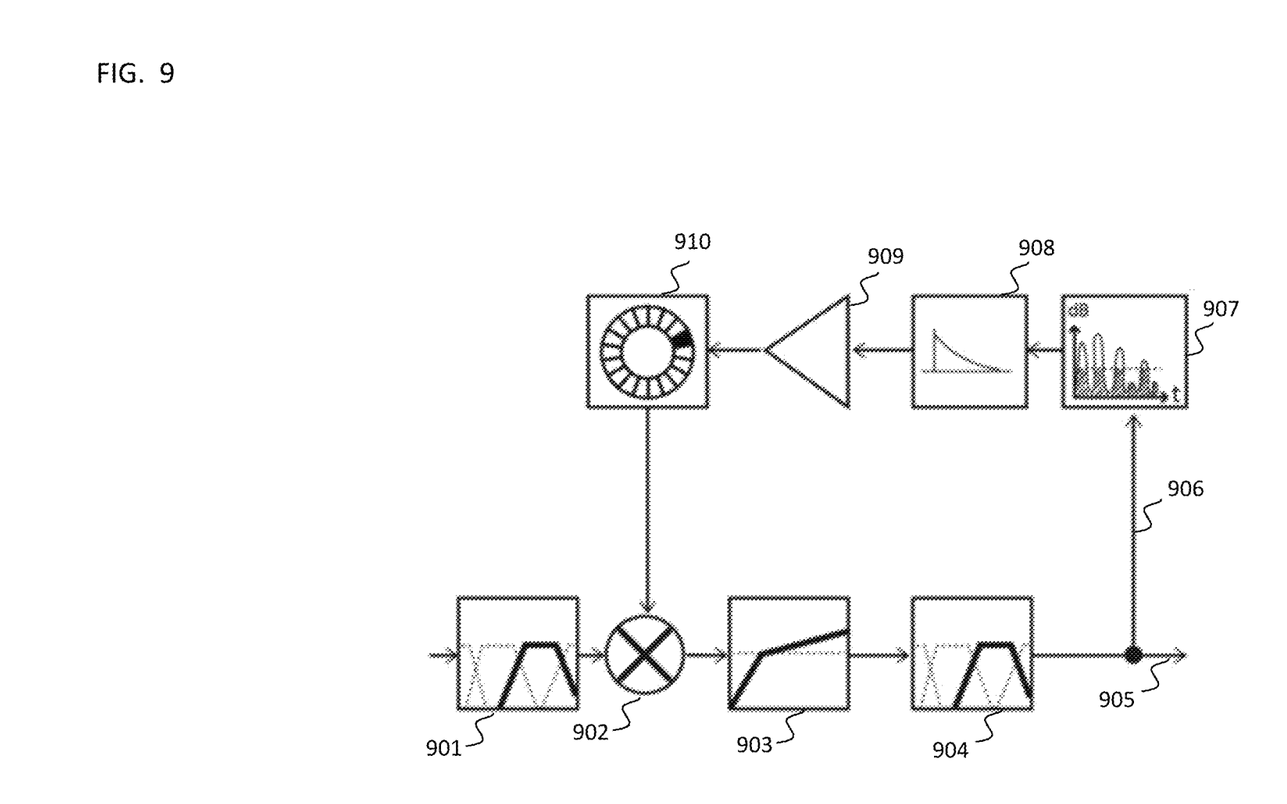
FIG. 9 is an example embodiment of the present invention, with a signal flow diagram depicting the compression scheme for each spectral band.

FIG. 9 illustrates another example of a possible implementation of the present invention, with a signal flow diagram depicting the compression scheme for each spectral band. The lower blocks represent the feed-forward path and the upper blocks are the feedback modules that comprise the delayed feedback attenuation control (DFAC). The input signal is band limited by the input filter 901, attenuated by an amount determined by the preceding input signal by the attenuator 902, wave-shaped by the instantaneous compression (IC) 903, re-band-pass-filtered to remove out-of-band distortion by the output filter 904. The signal is then sent onwards 905 for added gain and summation with other bands. The feedback pathway is tapped from the output 906 of the IC process. Any output exceeding the DFAC threshold is determined by the threshold 907, low-pass filtered by the low-pass filter 908, and multiplied by the DFAC Factor (F) 908 to give a decibel attenuation, which is delayed by the delay 910, and used to modulate the attenuator 902 before the IC 903.

What is claimed is:

1. A method of determining one or more operation parameters for a dynamic range compression system, the method comprising:
   obtaining, as an input, a parameter indicative of a hearing ability of a user, the parameter relating to a first difference in sound intensity between a maskee at a first frequency and a masker at a second frequency, wherein the sound intensity of the maskee and the sound intensity of the masker are such that the masker at the second frequency can still mask the maskee at the first frequency;
   determining a target value for the parameter based on the actual value of the parameter and a value for the parameter that would be expected for a reference user; and
   determining the one or more operation parameters such that a second difference in sound intensity between the sound intensity of the maskee after sound intensity modification by the dynamic range compressor configured with the one or more operation parameters and the sound intensity of the masker after dynamic range compression by the dynamic range compressor configured with the one or more operation parameters corresponds to the target value for the parameter,
   wherein determining the one or more operation parameters further involves determining the one or more parameters such that a dependence of the second difference in sound intensity on the sound intensity of the maskee is minimized for a given range of sound intensities of the maskee.

2. The method according to claim 1, further comprising:
   obtaining, as an input, a model function of dynamic range compression by the dynamic range compressor;
   determining the sound intensities of the maskee and the masker after dynamic range compression, in terms of the parameters of the model function, by applying the model function to the sound intensities; and
   determining the one or more operation parameters based on the sound intensities of the maskee and the masker after dynamic range compression in terms of the parameters of the model function.

3. The method according to claim 1, further comprising:
   determining the given range of sound intensities of the maskee based on a dynamic range of input levels of audio content that is to be processed by the dynamic range compressor.

4. The method according to claim 1, wherein:
   the one or more operation parameters include a ratio of the dynamic range compressor; and
   determining the one or more operation parameters further involves applying the condition that the ratio has a predetermined value.

5. The method according to claim 1, wherein:
   the one or more operation parameters include a threshold of the dynamic range compressor; and
   determining the one or more operation parameters further involves applying the condition that the threshold has a predetermined value or is within a predetermined margin around the predetermined value.

6. The method according to claim 1, wherein the target value for the parameter is determined using a look-up table.

7. The method according to claim 1, wherein determining the target value for the parameter involves determining a desired improvement amount for the outcome from the application of the parameter based on the actual value of the parameter and a value for the parameter that would be obtained for the reference user.

8. The method according to claim 1, wherein the reference user is assumed to have good hearing ability.

9. The method according to claim 1, wherein the second frequency is different from the first frequency by a predetermined relationship between both frequencies.

10. The method according to claim 1, further comprising determining the one or more operation parameters for each of a plurality of frequency bands, wherein for each of the plurality of frequency bands, the first frequency is chosen to lie within the respective frequency band and the second frequency is chosen to not lie within the respective frequency band.

11. The method according to claim 1, the ratio of the first frequency and the second frequency does not vary between different frequency bands.

12. The method according to claim 1, further comprising using the determined one or more operation parameters for configuring the dynamic range compressor.

13. A system comprising:
   a processor; and
   a memory storing instructions which when executed causes the processor to:

obtain, as an input, a parameter indicative of a hearing ability of a user, the parameter relating to a first difference in sound intensity between a maskee at a first frequency and a masker at a second frequency, wherein the sound intensity of the maskee and the sound intensity of the masker are such that the masker at the second frequency can still mask the maskee at the first frequency;

determine a target value for the parameter based on the actual value of the parameter and a value for the parameter that would be expected for a reference user;

determine one or more operation parameters such that a second difference in sound intensity between the sound intensity of the maskee after sound intensity modification by a dynamic range compressor configured with the one or more operation parameters and the sound intensity of the masker after dynamic range compression by the dynamic range compressor configured with the one or more operation parameters corresponds to the target value for the parameter, wherein determining the one or more operation parameters further involves determining the one or more parameters such that a dependence of the second difference in sound intensity on the sound intensity of the maskee is minimized for a given range of sound intensities of the maskee.

14. The system according to claim 13, wherein the instructions further cause the processor to:

obtain, as an input, a model function of dynamic range compression by the dynamic range compressor;

determine the sound intensities of the maskee and the masker after dynamic range compression, in terms of the parameters of the model function, by applying the model function to the sound intensities; and determine the one or more operation parameters based on the sound intensities of the maskee and the masker after dynamic range compression in terms of the parameters of the model function.

15. The system according to claim 13, wherein the instructions further cause the processor to determine the given range of sound intensities of the maskee based on a dynamic range of input levels of audio content that is to be processed by the dynamic range compressor.

16. The system according to claim 13, wherein:
the one or more operation parameters include a ratio of the dynamic range compressor; and
determining the one or more operation parameters further involves applying the condition that the ratio has a predetermined value.

17. The system according to claim 13, wherein:
the one or more operation parameters include a threshold of the dynamic range compressor; and
determining the one or more operation parameters further involves applying the condition that the threshold has a predetermined value or is within a predetermined margin around the predetermined value.

18. The system according to claim 13, wherein the target value for the parameter is determined using a look-up table.

19. A non-transitory computer readable medium storing instructions which when executed causes the processor to:

obtain, as an input, a parameter indicative of a hearing ability of a user, the parameter relating to a first difference in sound intensity between a maskee at a first frequency and a masker at a second frequency, wherein the sound intensity of the maskee and the sound intensity of the masker are such that the masker at the second frequency can still mask the maskee at the first frequency;

determine a target value for the parameter based on the actual value of the parameter and a value for the parameter that would be expected for a reference user;

determine one or more operation parameters such that a second difference in sound intensity between the sound intensity of the maskee after sound intensity modification by a dynamic range compressor configured with the one or more operation parameters and the sound intensity of the masker after dynamic range compression by the dynamic range compressor configured with the one or more operation parameters corresponds to the target value for the parameter, wherein determining the one or more operation parameters further involves determining the one or more parameters such that a dependence of the second difference in sound intensity on the sound intensity of the maskee is minimized for a given range of sound intensities of the maskee.

20. The non-transitory computer readable medium according to claim 19, further comprising instructions which when executed causes the processor to:

obtain, as an input, a model function of dynamic range compression by the dynamic range compressor;

determine the sound intensities of the maskee and the masker after dynamic range compression, in terms of the parameters of the model function, by applying the model function to the sound intensities; and determine the one or more operation parameters based on the sound intensities of the maskee and the masker after dynamic range compression in terms of the parameters of the model function.

* * * * *